United States Patent
Wei et al.

(10) Patent No.: US 12,445,798 B2
(45) Date of Patent: Oct. 14, 2025

(54) AUDIO SIGNAL PROCESSING METHOD AND ELECTRONIC DEVICE

(71) Applicant: HONOR DEVICE CO., LTD., Shenzhen (CN)

(72) Inventors: Tong Wei, Shenzhen (CN); Qinglin Zeng, Shenzhen (CN); Haihong Zhang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 18/038,768

(22) PCT Filed: Dec. 12, 2022

(86) PCT No.: PCT/CN2022/138456
§ 371 (c)(1),
(2) Date: May 25, 2023

(87) PCT Pub. No.: WO2023/197646
PCT Pub. Date: Oct. 19, 2023

(65) Prior Publication Data
US 2024/0267697 A1    Aug. 8, 2024

(30) Foreign Application Priority Data
Apr. 12, 2022 (CN) .......................... 202210380751.5

(51) Int. Cl.
*H04S 7/00* (2006.01)

(52) U.S. Cl.
CPC .......... *H04S 7/304* (2013.01); *H04S 2420/01* (2013.01)

(58) Field of Classification Search
CPC . H04S 7/304; H04S 1/00; H04S 7/306; H04S 2420/01
See application file for complete search history.

(56) References Cited

U.S. PATENT DOCUMENTS

| | | | |
|---|---|---|---|
| 9,973,871 B2 | 5/2018 | Koppens et al. | |
| 10,038,967 B2 * | 7/2018 | Jot | G10L 19/018 |

(Continued)

FOREIGN PATENT DOCUMENTS

| | | |
|---|---|---|
| CN | 104919820 A | 9/2015 |
| CN | 109644314 A | 4/2019 |

(Continued)

OTHER PUBLICATIONS

Christoph Pörschmann et al;"Binauralization of Omnidirectional Room Impulse Responses—Algorithm and Technical Evaluation"; Sep. 5, 2017;Retrieved from the internet, URL:https://www.researchgate.net/publication/319505245_Binauralization_of_Omnidirectional_Room_Impulse_Responses_-_Algorithm_and_Technical_Evaluation.

*Primary Examiner* — Paul Kim
(74) *Attorney, Agent, or Firm* — WOMBLE BOND DICKINSON (US) LLP

(57) ABSTRACT

This application relates to the audio field, and discloses an audio signal processing method and an electronic device, to resolve a problem that a stereo audio signal is directly input to a user through a headset and original expressive and immersive feelings of audio content cannot be accurately restored. A specific solution is as follows: A direct part and a diffusion part are separated from an audio signal. A corresponding room impulse response is obtained from a preset room impulse response database based on a current scene. Synthesis is performed based on a head-related transfer function and the room impulse response to obtain a binaural room impulse response for sense-of-orientation rendering and a binaural room impulse response for sense-of-space rendering.

20 Claims, 11 Drawing Sheets

(56) References Cited

U.S. PATENT DOCUMENTS

| | | |
|---|---|---|
| 10,187,740 B2 | 1/2019 | Family et al. |
| 10,555,107 B2 | 2/2020 | Ehara et al. |
| 2015/0030160 A1 | 1/2015 | Lee et al. |
| 2018/0077514 A1 | 3/2018 | Lee et al. |
| 2018/0091920 A1 | 3/2018 | Family |
| 2019/0014431 A1 | 1/2019 | Lee et al. |
| 2020/0388291 A1 | 12/2020 | Lee et al. |
| 2023/0100071 A1 | 3/2023 | Eronen et al. |

FOREIGN PATENT DOCUMENTS

| | | |
|---|---|---|
| CN | 114025301 A | 2/2022 |
| WO | 2021186102 A1 | 9/2021 |
| WO | 2022108494 A1 | 5/2022 |

\* cited by examiner

Sound image A

Sound image A

AUDIO SIGNAL PROCESSING METHOD AND ELECTRONIC DEVICE

CROSS-REFERENCE TO RELATED APPLICATIONS

This application is a national stage of International Application No. PCT/CN2022/138456, filed on Dec. 12, 2022, which claims priority to Chinese Patent Application No. 202210380751.5, filed on Apr. 12, 2022. The disclosures of both of the aforementioned applications are hereby incorporated by reference in their entireties.

TECHNICAL FIELD

This application relates to the audio field, and in particular, to an audio signal processing method and an electronic device.

BACKGROUND

With the popularity of various electronic devices such as mobile phones, tablet computers, and notebook computers, people have increasing requirements for using these electronic devices for audio and video entertainment. For example, people play games, watch videos, or listen to music through mobile phones. More people start to wear headsets when playing games, watching videos, or listening to music through electronic devices, to avoid disturbing other people and achieve better listening experience.

However, an audio signal output by a headset is a binaural signal and is input to human ears through earphones on the left and the right respectively. Currently, most audio streams of programs (TV series, music, movies, and the like) on various audio and video platforms are mainly stereo. Although various rendering effects are added in an audio production stage, the effects are mainly focused on content of audio programs, and cannot cope with the following two types of replay devices: a speaker and a headset. Therefore, such stereo audio signals are directly input to users through headsets, and original expressive and immersive feelings of audio content cannot be accurately restored. For example, orientations, distances, sense of space, and surround sound of sound images in the content cannot be accurately restored.

SUMMARY

This application provides an audio signal processing method and an electronic device, to resolve a problem that a stereo audio signal is directly input to a user through a headset and original expressive and immersive feelings of audio content cannot be accurately restored.

To achieve the foregoing objective, the following technical solutions are used in this application:

According to a first aspect, this application provides an audio signal processing method. The method may be applied to an electronic device in an audio system. The audio system includes an electronic device and a headset that are communicatively connected. The method includes: splitting an audio signal into a direct part and a diffusion part; obtaining a corresponding room impulse response from a preset room impulse response database based on a current scene, where the room impulse response database includes room impulse responses corresponding to various scenes, and the current scene is a scene in which the electronic device is currently located; performing synthesis based on the room impulse response and a head-related transfer function to obtain a first binaural room impulse response for sense-of-orientation rendering and a second binaural room impulse response for sense-of-space rendering; rendering the direct part of the audio signal and the diffusion part of the audio signal based on the first binaural room impulse response to obtain a sense-of-orientation rendered audio signal; rendering the diffusion part of the audio signal based on the second binaural room impulse response to obtain a sense-of-space rendered audio signal; and synthesizing the sense-of-orientation rendered audio signal and the sense-of-space rendered audio signal, and inputting a synthesized signal to the headset.

In the foregoing technical solution, measurement of a room impulse response is simple, and one room needs to be measured only once. Therefore, a volume of data stored in a database that includes room impulse responses of different scenes is small, facilitating storage. Based on the current scene, the binaural room impulse response for sense-of-orientation rendering and the binaural room impulse response for sense-of-space rendering in the current scene can be conveniently obtained based on the corresponding room impulse response and head-related transfer function, perform sense-of-orientation rendering and sense-of-space rendering on the audio signal. In this way, the electronic device can render the audio signal based on different scenes, to more accurately restore original expressive and immersive feelings of audio content in the audio signal in the current scene for a user through the headset.

In a possible implementation, the performing synthesis based on the room impulse response and a head-related transfer function to obtain a first binaural room impulse response for sense-of-orientation rendering and a second binaural room impulse response for sense-of-space rendering includes: decomposing the room impulse response into a direct part of the room impulse response, an early reflection part of the room impulse response, and a later reverberation part of the room impulse response; performing synthesis based on the direct part of the room impulse response, the early reflection part of the room impulse response, and a head-related transfer function to obtain the first binaural room impulse response for sense-of-orientation rendering; and performing synthesis based on the early reflection part of the room impulse response, the later reverberation part of the room impulse response, and a head-related transfer function in a preset orientation to obtain the second binaural room impulse response for sense-of-space rendering.

The sense-of-orientation rendering is mainly intended to accurately restore a location of a sound image in a spatial sound field. Therefore, the first binaural room impulse response including orientation information needs to be obtained through synthesis to render a corresponding sound image. In addition, a direct part of an audio signal obtained through upmixing mainly includes dialogs and human voices. Therefore, the synthesized first binaural room impulse response cannot include a reverberation component. This leads to serious coloration of human voice signals. Therefore, synthesis may be performed based on the direct part of the room impulse response, the early reflection part of the room impulse response, and the head-related transfer function to obtain the first binaural room impulse response, so as to avoid serious coloration of human voice signals. In addition, the sense-of-space rendering is mainly intended to achieve a sense of space and surround sound of a replay sound field, and make audio rendering effects match an environment in which the user is currently located, to achieve immersive experience. The sense-of-space rendering is mainly performed based on the diffusion part (for example, a left-channel diffusion part and a right-channel diffusion part) of the audio signal. This part of the audio signal mainly includes ambient sound such as rain, wind, bird sound, and such signals have weak directionality. Therefore, the correspondingly generated second binaural room impulse response cannot include much orientation information (a part of the audio signal including orientation information is already included in sense-of-orientation rendering). Therefore, synthesis may be performed based on the early reflection part of the room impulse response, the later reverberation part of the room impulse response, and the head-related transfer function with a specified orientation to obtain the second binaural room impulse response, so as to avoid an excessively clear orientation after the sense-of-orientation rendering.

In another possible implementation, the head-related transfer function is a head-related transfer function obtained through matching and adjustment based on head tracking information sent by the headset.

In this way, orientations of sound images in a finally rendered audio signal do not rotate in space along with rotation of the user's head, that is, the sound images can remain stationary in space.

In another possible implementation, the head-related transfer function in the preset orientation includes: a head-related transfer function directly in front of a user's head, a head-related transfer function directly behind the user's head, a head-related transfer function on the left of the user's head, a head-related transfer function on the right of the user's head, a head-related transfer function above the user's head, and a head-related transfer function below the user's head.

This can provide uniform surround sound effects for the sense-of-space rendering.

In another possible implementation, the diffusion part of the audio signal includes a left-channel diffusion part and a right-channel diffusion part.

In another possible implementation, the current scene is a scene selected by the user.

In this way, the user can autonomously select the current scene according to a requirement of the user, to meet a requirement of the user for rendering effects of the audio signal.

In another possible implementation, the current scene is a scene recognized by the electronic device.

In this way, the electronic device recognizes the current scene, so that the user does not need to autonomously switch a scene during scene switching, but the electronic device can adaptively perform switching to improve user experience.

In another possible implementation, the current scene includes any one of a shopping mall, a cinema, a conference room, a concert hall, an office, a kitchen, and a living room.

In another possible implementation, the preset room impulse response database includes a room impulse response autonomously measured by the user.

In this way, the user can autonomously measure a room impulse response to increase the number of alternative scenes that can be used as the current scene, and a room impulse response in the room impulse response database can be more accurate than that in an actual scene in which the user is located.

In another possible implementation, the preset room impulse response database is stored in a cloud server.

This can prevent the room impulse response database from occupying local storage space of the electronic device.

According to a second aspect, this application provides an audio signal processing apparatus. The apparatus may be applied to an electronic device to implement the method in the first aspect. Functions of the apparatus may be implemented by hardware or by hardware executing corresponding software. The hardware or the software includes one or more modules corresponding to the functions, for example, a room impulse response database, a head-related transfer function container (HRTF container), a head-related transfer function selection and matching module, an upmixer module, a decomposer module, a first binaural room impulse response generation module, a second binaural room impulse response generation module, a sense-of-orientation rendering module, a sense-of-space rendering module, and a synthesis module.

The upmixer module may be configured to split an audio signal into a direct part and a diffusion part. The decomposer module may be configured to obtain a corresponding room impulse response from a preset room impulse response database based on a current scene, where the room impulse response database includes room impulse responses corresponding to various scenes, and the current scene is a scene in which the electronic device is currently located. The first binaural room impulse response generation module and the second binaural room impulse response generation module may be configured to perform synthesis based on the room impulse response and a head-related transfer function to obtain a first binaural room impulse response for sense-of-orientation rendering and a second binaural room impulse response for sense-of-space rendering respectively. The sense-of-orientation rendering module may be configured to render the direct part of the audio signal and the diffusion part of the audio signal based on the first binaural room impulse response to obtain a sense-of-orientation rendered audio signal. The sense-of-space rendering module may be configured to render the diffusion part of the audio signal based on the second binaural room impulse response to obtain a sense-of-space rendered audio signal. The synthesis module may be configured to synthesize the sense-of-orientation rendered audio signal and the sense-of-space rendered audio signal, and input a synthesized signal to a headset.

In a possible implementation, the decomposer module may be further configured to decompose the room impulse response into a direct part of the room impulse response, an early reflection part of the room impulse response, and a later reverberation part of the room impulse response: The first binaural room impulse response generation module is further configured to perform synthesis based on the direct part of the room impulse response, the early reflection part of the room impulse response, and a head-related transfer function to obtain the first binaural room impulse response for sense-of-orientation rendering. The second binaural room impulse response generation module is further configured to perform synthesis based on the early reflection part of the room impulse response, the later reverberation part of the room impulse response, and a head-related transfer function in a preset orientation to obtain the second binaural room impulse response for sense-of-space rendering.

In another possible implementation, the head-related transfer function is a head-related transfer function obtained through matching and adjustment based on head tracking information sent by the headset.

In another possible implementation, the head-related transfer function in the preset orientation includes: a head-related transfer function directly in front of a user's head, a head-related transfer function directly behind the user's head, a head-related transfer function on the left of the user's head, a head-related transfer function on the right of the user's head, a head-related transfer function above the user's head, and a head-related transfer function below the user's head.

In another possible implementation, the diffusion part of the audio signal includes a left-channel diffusion part and a right-channel diffusion part.

In another possible implementation, the current scene is a scene selected by the user.

In another possible implementation, the current scene is a scene recognized by the electronic device.

In another possible implementation, the current scene includes any one of a shopping mall, a cinema, a conference room, a concert hall, an office, a kitchen, and a living room.

In another possible implementation, the preset room impulse response database includes a room impulse response autonomously measured by the user.

In another possible implementation, the preset room impulse response database is stored in a cloud server.

According to a third aspect, an embodiment of this application provides an electronic device, including: a processor and a memory for storing instructions executable by the processor. When the processor is configured to execute the instructions, the electronic device is enabled to implement the audio signal processing method according to any one of the first aspect or the possible implementations of the first aspect.

According to a fourth aspect, an embodiment of this application provides a computer-readable storage medium, where the computer-readable storage medium stores computer program instructions. When the computer program instructions are executed by an electronic device, the electronic device is enabled to implement the audio signal processing method according to any one of the first aspect or the possible implementations of the first aspect.

According to a fifth aspect, an embodiment of this application provides a computer program product, including computer-readable code. When the computer-readable code is run on an electronic device, the electronic device is enabled to implement the audio signal processing method according to any one of the first aspect or the possible implementations of the first aspect.

It should be understood that, for beneficial effects of the second aspect to the fifth aspect, reference may be made to the related description in the first aspect, and details are not described herein again.

DESCRIPTION OF EMBODIMENTS

With the popularity of various electronic devices such as mobile phones, tablet computers, and notebook computers, people have increasing requirements for using these electronic devices for audio and video entertainment. For example, people play games, watch videos, or listen to music through mobile phones. More people start to wear headsets when playing games, watching videos, or listening to music through electronic devices, to avoid disturbing other people and achieve better listening experience.

However, an audio signal output by a headset is a binaural signal and is input to human ears through earphones on the left and the right respectively. Currently, most audio streams of programs (TV series, music, movies, and the like) on various audio and video platforms are mainly stereo. Although various rendering effects are added in an audio production stage, the effects are mainly focused on content of audio programs, and cannot cope with the following two types of replay devices: a speaker and a headset. Therefore, such stereo audio signals are directly input to users through headsets, and original expressive and immersive feelings of audio content cannot be accurately restored. For example, orientations, distances, sense of space, and surround sound of sound images in the content cannot be accurately restored.

Figure 1:
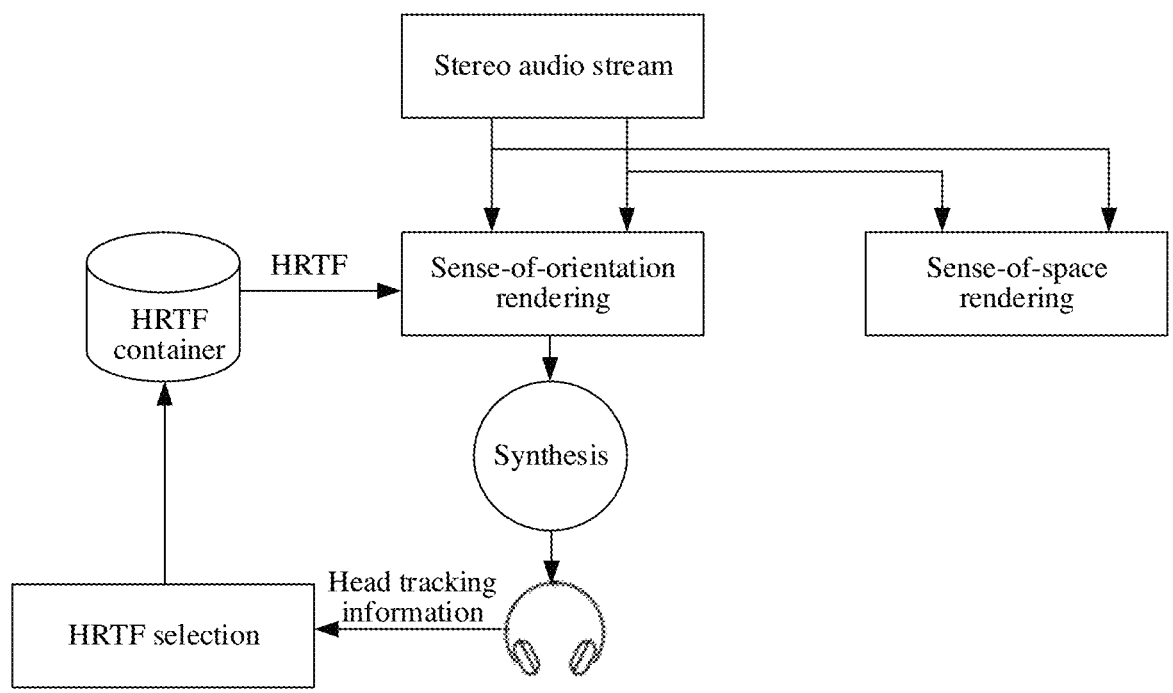
FIG. 1 is a schematic flowchart of an audio processing method in the conventional technology.

In the conventional technology, as shown in FIG. 1, usually, sense-of-orientation rendering is performed on a stereo audio stream by using a head-related transfer function (head related transfer functions, HRTF) (where the head-related transfer function for rendering may be obtained from a head-related transfer function container through selection and matching based on head tracking information sent by a headset), sense-of-space rendering is performed based on a preset binaural room impulse response or an artificial reverberation parameter, two rendered audio signals are synthesized, and then a synthesized signal is input to the headset.

In this technology, a parameter used in the sense-of-space rendering is a fixed parameter, and therefore an audio signal cannot be rendered differently for different room scenes. As a result, the rendering has low accuracy and cannot adapt to different room scenes.

To resolve the foregoing problems, the embodiments of this application provide an audio signal processing method. The method may be applied to an electronic device with a function of inputting an audio signal to a headset. For example, the electronic device may be a mobile phone. When a user connects a headset to the mobile phone and then listens to music played on the mobile phone through the headset, the mobile phone may use this method to process audio corresponding to the played music, and input processed audio to the headset. In this way, the mobile phone can more accurately restore, for the user through the headset, original expressive and immersive feelings of the music played on the mobile phone.

Usually, an audio signal (for example, an audio signal in a video, a game, or music) may be divided into a direct part and a diffusion part. The direct part includes a signal of a sound wave that is generated by a sound source and that directly reaches a listener's location, and some signals reflected to the listener's location for the first time or the first several times. The direct part mainly affects location information of a sound source in a sound field, for example, an orientation or a distance of the sound source. The diffusion part includes a signal reflected from the sound source to the listener's location in a middle stage or a late stage. The diffusion part mainly affects surround sound and a sense of space of the sound field.

Based on the foregoing characteristics of the audio signal, the audio signal processing method may be as follows: When the electronic device inputs an audio signal to the headset, the mobile phone performs upmixing on the audio signal to separate a direct part and a diffusion part from the audio signal. A corresponding room impulse response (room impulse response, RIR) is obtained from a preset room impulse response database based on a current scene. Synthesis is performed based on a head-related transfer function and the room impulse response to obtain a binaural room impulse response (binaural room impulse response, BRIR) for sense-of-orientation rendering and a binaural room impulse response for sense-of-space rendering. Then sense-of-orientation rendering is performed on the direct part and the diffusion part separated from the audio signal based on the binaural room impulse response for sense-of-orientation rendering, and sense-of-space rendering is performed on the diffusion part separated from the audio signal based on the binaural room impulse response for sense-of-space rendering. Finally, a rendered audio signal may be input to the headset.

The head-related transfer function may be used for describing a process of transmission of a sound wave from a sound source to both ears, and is a sound localization algorithm. When sound is transmitted to a user, the head-related transfer function responds based on a phase and a frequency of the user's head. In this way, a sound image in a corresponding orientation of the head may be processed by using the head-related transfer function, so that the user is aware of a corresponding orientation of the sound image.

With respect to the room impulse response, a signal sequence that is radiated by a pulsed sound source and that is received at a reception location in a sound field of a room is measured. The room impulse response can reflect sound field characteristics of a corresponding room. The binaural room impulse response describes a process of transmission of sound from a sound source to both ears of a listener, and synthesizes impact of a room and a listener on a sound wave. The binaural room impulse response can reflect characteristics of a sound field that the listener is aware of in a corresponding room.

The current scene is a user-selected or intelligently recognized room scene in which the electronic devices inputs the audio signal to the headset, for example, a shopping mall, a cinema, a conference room, a concert hall, an office, a kitchen, or a living room.

For example, based on different wearing modes, the headset in this embodiment of this application may be a headphone, earbuds, or earphones. Based on different connection mode, the headset in the embodiments of this application may be a Bluetooth headset, a wired headset, a true wireless stereo (true wireless stereo, TWS) headset, or the like.

Measurement of a room impulse response is simple, and one room needs to be measured only once. Therefore, a volume of data stored in a database that includes room impulse responses of different scenes is small, facilitating storage. Based on the current scene, the binaural room impulse response for sense-of-orientation rendering and the binaural room impulse response for sense-of-space rendering in the current scene can be conveniently obtained based on the corresponding room impulse response and head-related transfer function, perform sense-of-orientation rendering and sense-of-space rendering on the audio signal. In this way, the electronic device can render the audio signal based on different scenes, to more accurately restore original expressive and immersive feelings of audio content in the audio signal in the current scene for a user through the headset.

The following describes the audio signal processing method provided in the embodiments of this application with reference to the accompanying drawings.

In the embodiments of this application, the electronic device has a function of inputting an audio signal to a headset, and may be a mobile phone, a tablet computer, a handheld computer, a PC, a cellular phone, a personal digital assistant (personal digital assistant, PDA), a wearable device (for example, a smartwatch or a smart band), a smart home device (for example, a television), a vehicle-mounted machine (for example, a vehicle-mounted computer), a smart screen, a projector, a game console, a camera, an augmented reality (augmented reality, AR)/virtual reality (virtual reality, VR) device, or the like. A specific device form of the electronic device is not particularly limited in the embodiments of this application.

Figure 2:
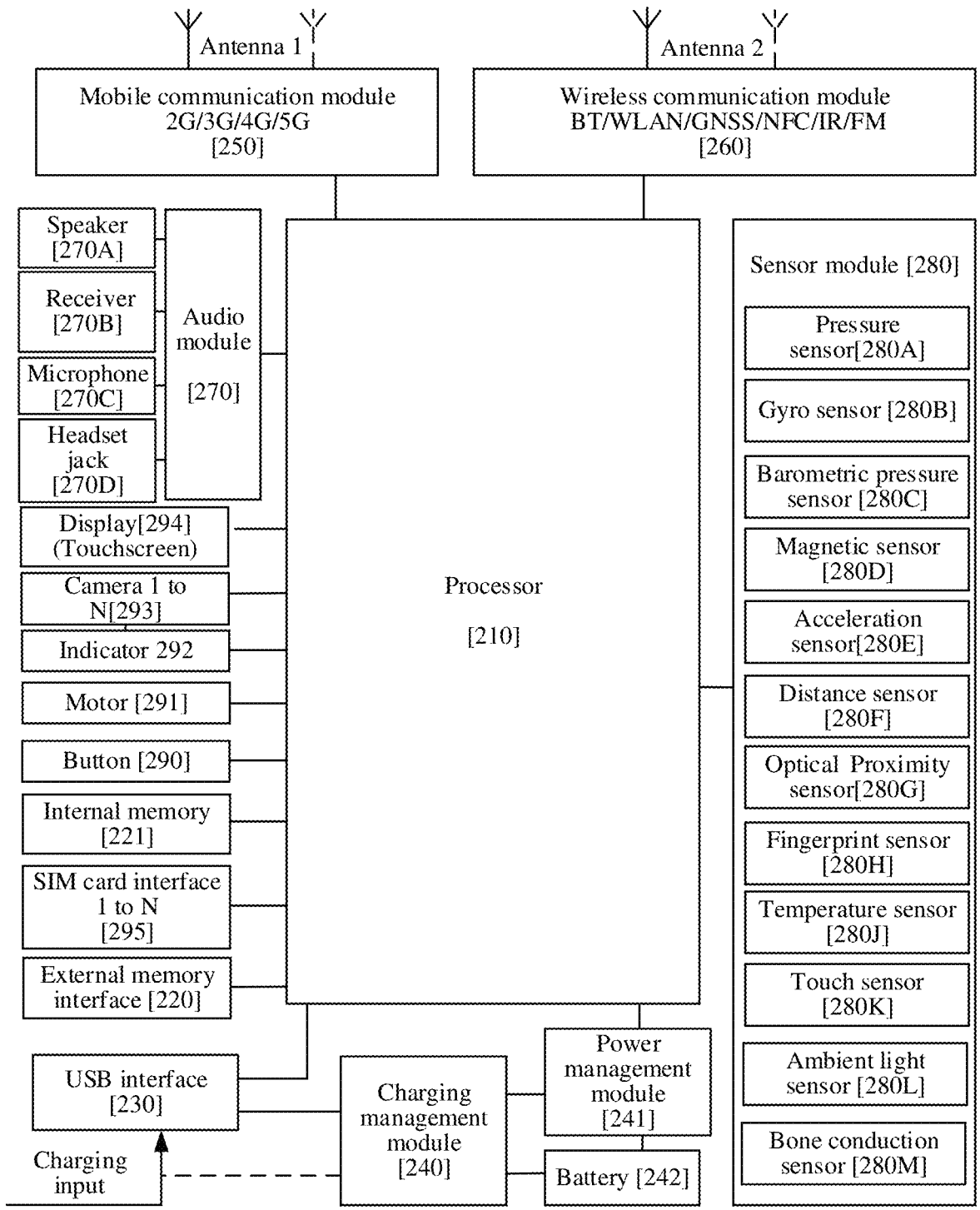
FIG. 2 is a schematic structural diagram of an electronic device according to an embodiment of this application.

For example, the electronic device is a mobile phone, and FIG. 2 is a schematic structural diagram of an electronic device according to an embodiment of this application. That is, for example, the electronic device shown in FIG. 2 may be a mobile phone.

As shown in FIG. 2, the electronic device may include a processor 210, an external memory interface 220, an internal memory 221, a universal serial bus (universal serial bus, USB) interface 230), a charging management module 240), a power management unit 241, a battery 242, an antenna 1, an antenna 2, a mobile communication module 250, a wireless communication module 260, an audio module 270, a speaker 270A, a receiver 270B, a microphone 270C, a headset jack 270D, a sensor module 280, a button 290, a motor 291, an indicator 292, a camera 293, a display 294, and a subscriber identification module (subscriber identification module, SIM) card interface 295. The sensor module 280 may include a pressure sensor 280A, a gyroscope sensor 280B, a barometric pressure sensor 280C, a magnetic sensor 280D, an acceleration sensor 280E, a distance sensor 280F, an optical proximity sensor 280G, a fingerprint sensor 280H, a temperature sensor 280J, a touch sensor 280K, an ambient light sensor 280L, a bone conduction sensor 280M, and the like.

It may be understood that the schematic structure in this embodiment constitutes no specific limitation on the electronic device. In some other embodiments, the electronic device may include more or fewer components than those shown in the figure, or some components may be combined, or some components may be split, or components are arranged in different manners. The components shown in the figure may be implemented by hardware, software, or a combination of software and hardware.

The processor 210 may include one or more processing units. For example, the processor 210 may include an application processor (application processor, AP), a modem processor, a graphics processing unit (graphics processing unit, GPU), an image signal processor (image signal processor, ISP), a controller, a memory, a video codec, a digital signal processor (digital signal processor, DSP), a baseband processor, a neural-network processing unit (neural-network processing unit, NPU), and/or the like. Different processing units may be separate devices, or may be integrated into one or more processors.

The controller may be a nerve center and a command center of the electronic device. The controller may generate an operation control signal according to instruction operation code and a time-sequence signal, and control obtaining and executing of instructions.

A memory may be further arranged in the processor 210 to store instructions and data. In some embodiments, the memory in the processor 210 is a cache memory. The memory may store an instruction or data that is just used or cyclically used by the processor 210. If the processor 210 needs to use the instruction or data again, the processor may directly invoke the instruction or data from the memory. This avoids repeated access and reduces a waiting time of the processor 210, thereby improving system efficiency.

In some embodiments, the processor 210 may include one or more interfaces. The interface may include an integrated circuit (inter-integrated circuit, I2C) interface, an inter-integrated circuit sound (inter-integrated circuit sound, I2S) interface, a pulse code modulation (pulse code modulation, PCM) interface, a universal asynchronous receiver/transmitter (universal asynchronous receiver/transmitter, UART) interface, a mobile industry processor interface (mobile industry processor interface, MIPI), a general-purpose input/output (general-purpose input/output, GPIO) interface, a subscriber identity module (subscriber identity module, SIM) interface, a universal serial bus (universal serial bus, USB) interface, and/or the like.

A wireless communication function of the electronic device may be implemented through the antenna 1, the antenna 2, the mobile communication module 250, the wireless communication module 260, the modem processor, and the baseband processor.

The antenna 1 and the antenna 2 are configured to transmit and receive an electromagnetic wave signal. Each antenna in the electronic device may be configured to cover one or more communication frequency bands. Different antennas may further be multiplexed to improve utilization of the antennas. For example, the antenna 1 may be multiplexed into a diversity antenna of a wireless local area network. In some other embodiments, the antennas may be used with a tuning switch.

The mobile communication module 250 can provide a wireless communication solution including 2G/3G/4G/5G and the like applied on the electronic device. The mobile communication module 250 may include at least one filter, a switch, a power amplifier, and a low noise amplifier (low noise amplifier, LNA). The mobile communication module 250 may receive an electromagnetic wave by using the antenna 1, perform processing such as filtering and amplification on the received electromagnetic wave, and send the electromagnetic wave to the modem processor for demodulation. The mobile communication module 250 may further amplify a signal modulated by the modem processor, and convert the signal into an electromagnetic wave by using the antenna 1 for radiation. In some embodiments, at least some functional modules of the mobile communication module 250 may be disposed in the processor 210. In some embodiments, at least some functional modules of the mobile communication module 250 and at least some modules of the processor 210 may be disposed in a same component.

The wireless communication module 260 may provide a solution to wireless communication applied to the electronic device, for example, a wireless local area network (wireless local area networks, WLAN) (for example, a wireless fidelity (wireless fidelity, Wi-Fi) network), Bluetooth (Bluetooth, BT), a global navigation satellite system (global navigation satellite system, GNSS), frequency modulation (frequency modulation, FM), near field communication (near field communication, NFC), and an infrared (infrared, IR) technology. The wireless communication module 260 may be one or more components that integrate at least one communication processing module. The wireless communication module 260 receives an electromagnetic wave through the antenna 2, performs frequency modulation and filtering processing on the electromagnetic wave signal, and sends the processed signal to the processor 210. The wireless communication module 260 may further receive a to-be-sent signal from the processor 210, perform frequency modulation and amplification on the to-be-sent signal, and convert the to-be-sent signal into an electromagnetic wave for radiation through the antenna 2.

In some embodiments, the antenna 1 and the mobile communication module 250 of the electronic device are coupled, and the antenna 2 and the wireless communication module 260 of the electronic device are coupled, so that the electronic device can communicate with a network and another device by using a wireless communication technology. The wireless communication technology may include a global system for mobile communication (global system for mobile communication, GSM), a general packet radio service (general packet radio service, GPRS), code division multiple access (code division multiple access, CDMA), wideband code division multiple access (wideband code division multiple access, WCDMA), time-division code division multiple access (time-division code division multiple access, TD-SCDMA), long term evolution (long term evolution, LTE), BT, GNSS, WLAN, NFC, FM, and/or IR technologies. The GNSS may include a global positioning system (global positioning system, GPS), a global navigation satellite system (global navigation satellite system, GLONASS), a BeiDou navigation satellite system (BeiDou navigation satellite system, BDS), a quasi-zenith satellite system (quasi-zenith satellite system, QZSS) and/or satellite-based augmentation systems (satellite based augmentation systems, SBAS).

The electronic device implements a display function through the GPU, the display 294, the application processor. The GPU is a microprocessor for image processing and connects the display 294 and the application processor. The GPU is configured to perform mathematical and geometric calculations, and is configured to render graphics. The processor 210 may include one or more GPUs, and execute program instructions to generate or change display information.

The display 294 is configured to display an image and a video. The display 294 includes a display panel. The display panel may be a liquid crystal display (liquid crystal display, LCD), an organic light-emitting diode (organic light-emitting diode, OLED), an active-matrix organic light emitting diode (active-matrix organic light emitting diode, AMO-LED), a flexible light-emitting diode (flex light-emitting diode, FLED), a mini-LED, a micro-LED, a micro-OLED, and a quantum dot light emitting diode (quantum dot light emitting diodes, QLED). In some embodiments, the electronic device may include one or N displays 294. N is a positive integer greater than 1.

The electronic device may implement a photographing function by using the ISP, the camera 293, the video codec, the GPU, the display 294, the application processor, and the like. In some embodiments, the electronic device may include 1 or N cameras 293, where N is a positive integer greater than 1. For example, in this embodiment of this application, the electronic device may include three cameras: a main camera, a long-focus camera, and an ultra-wide angle camera; or the electronic device may include only one main camera. Optionally, the electronic device may further include a depth camera or a depth sensor to detect a depth of a viewfinder image during photographing.

The internal memory 221 may be configured to store computer executable program code. The executable program code includes instructions. The processor 210 runs the instruction stored in the internal memory 221, to perform various function applications and data processing of the electronic device. The internal memory 221 may include a program storage area and a data storage area. The program storage area may store an operating system, an application required by at least one function (such as a voice playing function and an image playing function), and the like. The data storage region may store data (for example, audio data and an address book) and the like created when the electronic device is used. In addition, the internal memory 221 may include a high-speed random access memory, or may include a non-volatile memory such as at least one magnetic disk memory, a flash memory, or a universal flash storage (universal flash storage, UFS).

Certainly, it may be understood that, FIG. 2 only shows an exemplary description when the form of the electronic device is a mobile phone. If the electronic device is a tablet computer, a handheld computer, a PC, a PDA, or a wearable device (for example, a smartwatch or a smart band), a smart home device (for example, a television), a vehicle-mounted machine (for example, a vehicle-mounted computer), a smart screen, a game console, a projector, an AR/VR device, or in another device form, the electronic device may include fewer structures than those shown in FIG. 2, or may include more structures than those shown in FIG. 2. This is not limited herein.

Methods in the following embodiments may all be implemented in the electronic device having the foregoing hardware structure.

Figure 3:
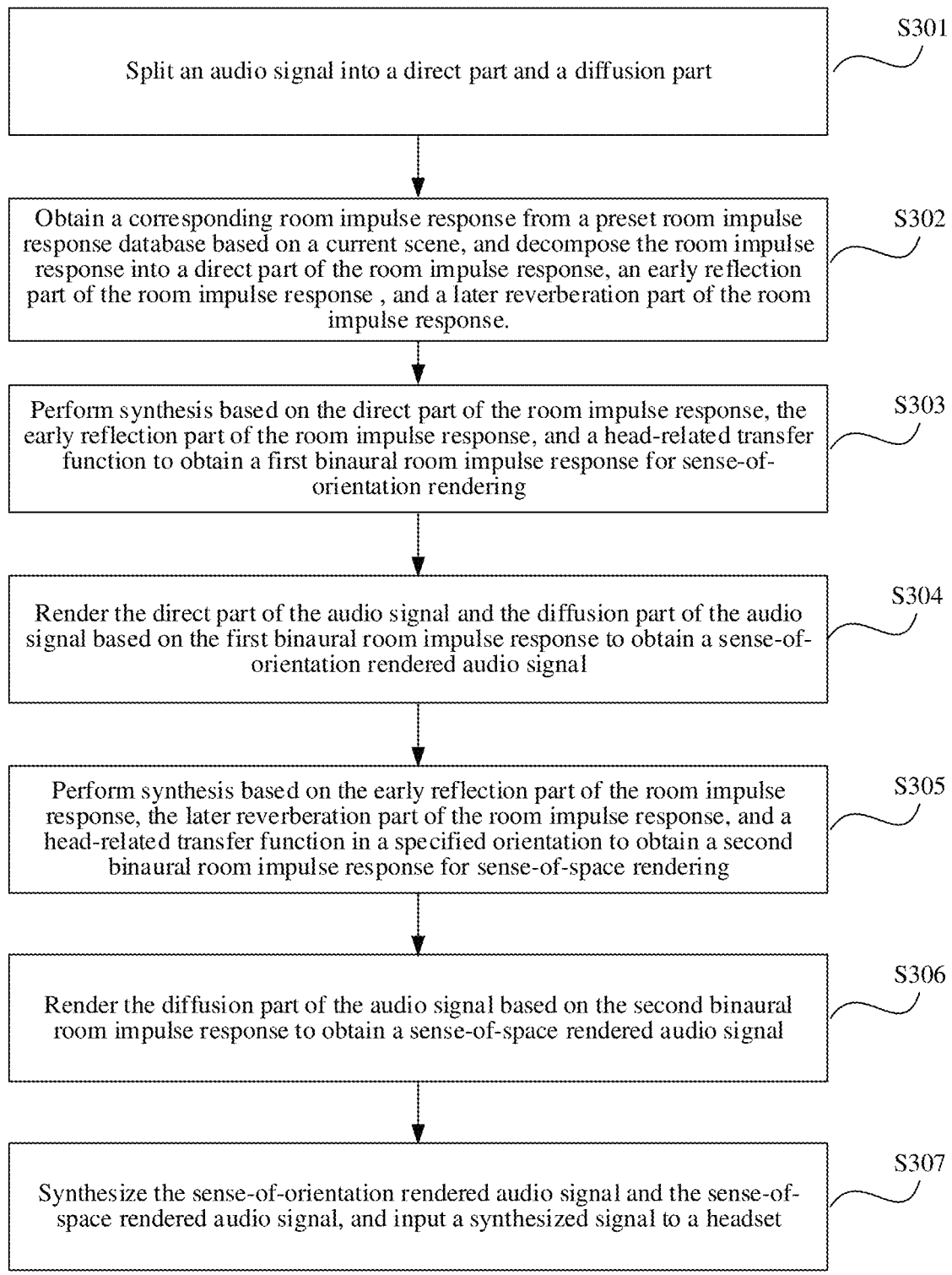
FIG. 3 is a schematic flowchart of an audio processing method according to an embodiment of this application.

For example, the electronic device is a mobile phone, and FIG. 3 is a schematic flowchart of an audio signal processing method according to an embodiment of this application. As shown in FIG. 3, the audio signal processing method includes S301 to S307.

S301: Split an audio signal into a direct part and a diffusion part.

Usually, an audio signal generated by the electronic device based on audio data of a video, a game, or music is a stereo audio signal (usually including a left-channel part and a right-channel part) to meet a requirement for dual-speaker or headset playback. That is, the audio signal generated by the electronic device is usually an audio signal obtained through deep mixing and decomposition or combination of sound images in different orientations based on dual channels. Therefore, if the audio signal generated by the electronic device is directly used for rendering, a sound field of a rendered audio signal is unclear, and orientations of sound images are inaccurate. Therefore, upmixing may be performed on the audio signal generated by electronic device to split the audio signal into the direct part of the audio signal and the diffusion part of the audio signal.

The direct part of the audio signal usually includes a signal of a sound wave that is generated by a sound source and that directly reaches a listener's location, and some signals reflected to the listener's location for the first time or the first several times, and mainly affects location information of a sound source in a sound field. The diffusion part includes a signal reflected from the sound source to the listener's location in a middle stage or a late stage, and mainly affects surround sound and a sense of space of the sound field.

Optionally, the diffusion part of the audio signal may include a left-channel diffusion part (L_diffuse) and a right-channel diffusion part (R_diffuse).

For example, the audio signal may be split by using an upmixing algorithm such as an upmixing matrix method, a principal component analysis method, or a least mean square error decomposition method, to obtain the direct part of the audio signal and the diffusion part of the audio signal.

For example, the upmixing matrix method is used for splitting the audio signal generated by the electronic device. The direct part of the audio signal and the diffusion part of the audio signal may be obtained through splitting based on the following formula:

$$\begin{bmatrix} L\_diffuse \\ C\_direct \\ R\_diffuse \end{bmatrix} = \begin{bmatrix} 0.885 & -0.115 \\ 0.451 & 0.451 \\ -0.115 & 0.885 \end{bmatrix} \begin{bmatrix} L \\ R \end{bmatrix},$$

where

L_diffuse is the left-channel diffusion part of the audio signal, R_diffuse is the right-channel diffusion part of the audio signal, C_direct is the direct part of the audio signal, L is the left-channel part of the audio signal generated by the electronic device, and R is the right-channel part of the audio signal generated by the electronic device.

S302: Obtain a corresponding room impulse response from a preset room impulse response database based on a current scene, and decompose the room impulse response into a direct part of the room impulse response (RIR_direct_part), an early reflection part of the room impulse response (RIR_early_reflection), and a later reverberation part of the room impulse response (RIR_later_reverberation).

Figure 4:
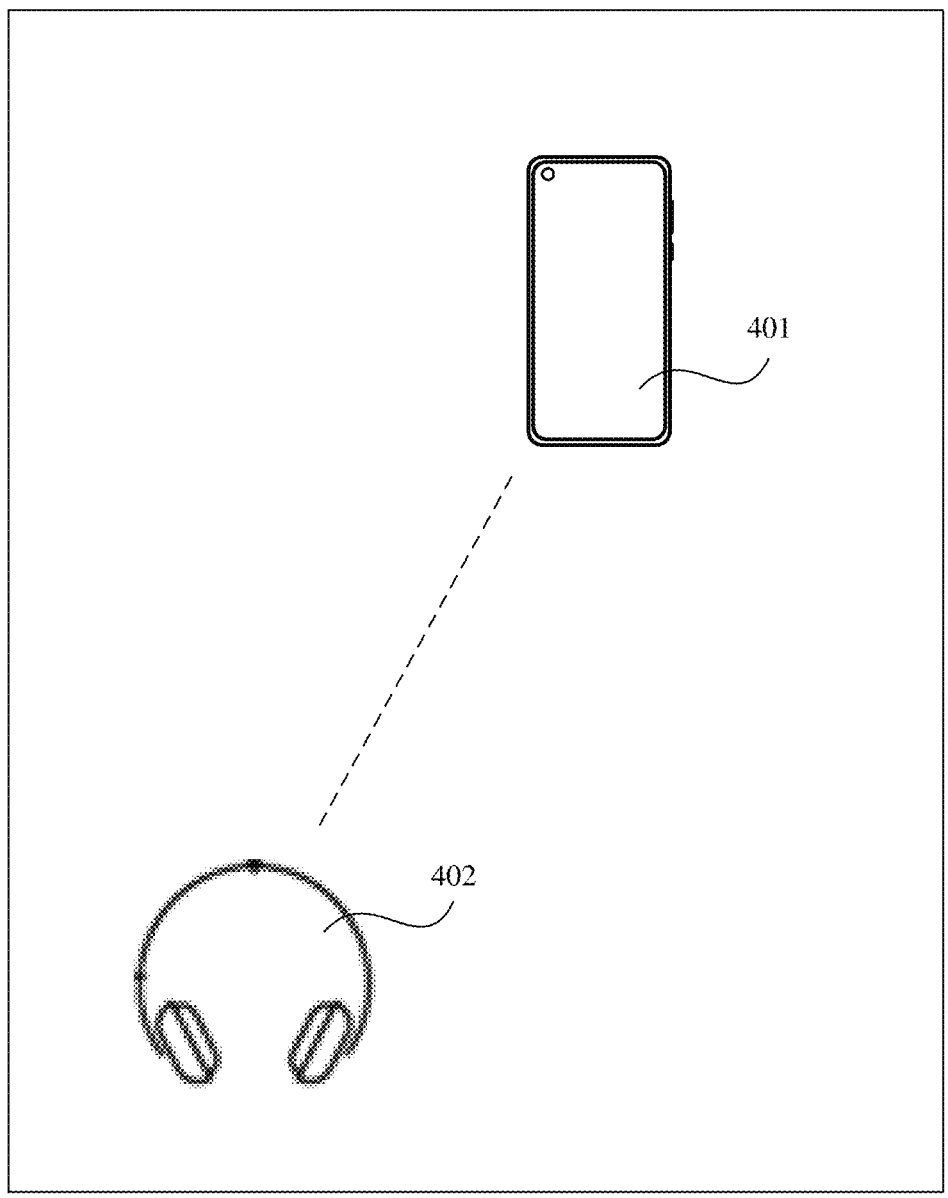
FIG. 4 is a schematic diagram of a scenario of measuring a room impulse response according to an embodiment of this application.

The preset room impulse response database may be a database established based on room impulse responses that are obtained by pre-measuring different room scenes and that correspond to the room scenes. Optionally, for a private room scene such as an office, a living room, a kitchen, or a bedroom, a user may alternatively autonomously measure a room impulse response of a corresponding room scene and add the room impulse response to the database. For example, as shown in FIG. 4, a user may place a mobile phone 401 and a headset 402 that are communicatively connected to each other apart in a room that needs to be measured. Then specific audio for measurement is played through a speaker of the mobile phone 401, and the specific audio is received and transmitted to the mobile phone 401 through a microphone of the headset 402. In this way, the mobile phone 401 can process an audio signal received by the microphone of the headset 402 to obtain a room impulse response of a corresponding room.

Optionally, room impulse responses of all room scenes in the room impulse response database may alternatively be autonomously measured and stored by a user. This is not limited herein.

The room impulse response database may be stored in a cloud (namely, a cloud server), and the electronic device downloads and obtains, from the cloud, the room impulse response corresponding to the current scene. Optionally, the database may be locally stored on the electronic device. This is not limited herein. For example, a room impulse response of a private room scene that is autonomously measured by a user may alternatively be locally stored on the electronic device, and room impulse responses of other public room scenes are stored in the cloud. That is, the room impulse response database includes a private database (a database including room impulse responses autonomously measured by the user) and a public database (a database including pre-measured and prestored room impulse responses of public room scenes). The private database is stored locally, and the public database is stored in the cloud.

Optionally, the current scene is a room scene in which the electronic device is currently located, for example, a shopping mall, a cinema, a conference room, a concert hall, an office, a kitchen, or a living room.

It should be noted that the current scene may be selected by the user or intelligently recognized by the electronic device.

Figure 5A:
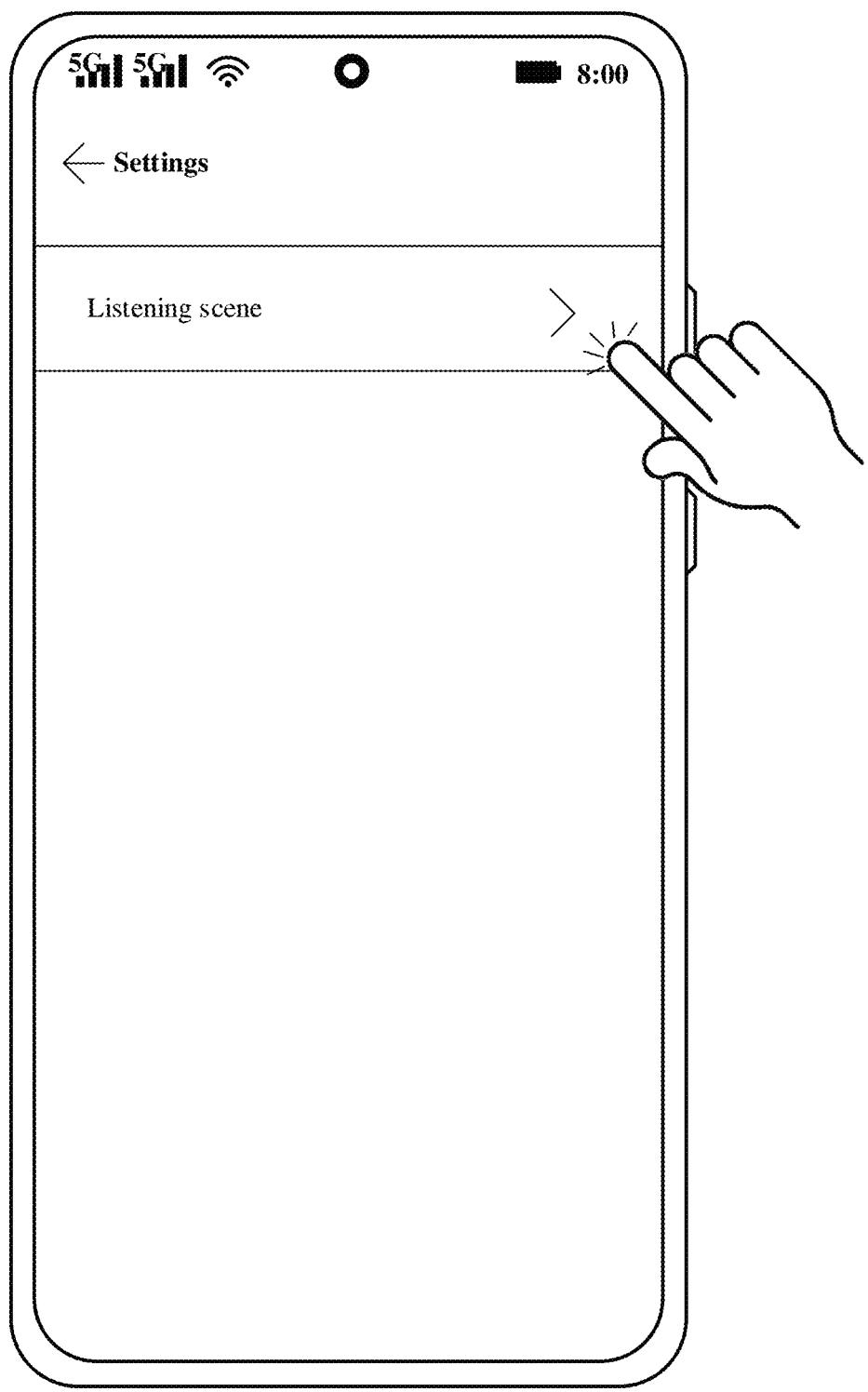
FIG. 5*a* and FIG. 5*b* are schematic diagrams of interfaces of an electronic device when a user selects a current scene according to an embodiment of this application.
Figure 5B:
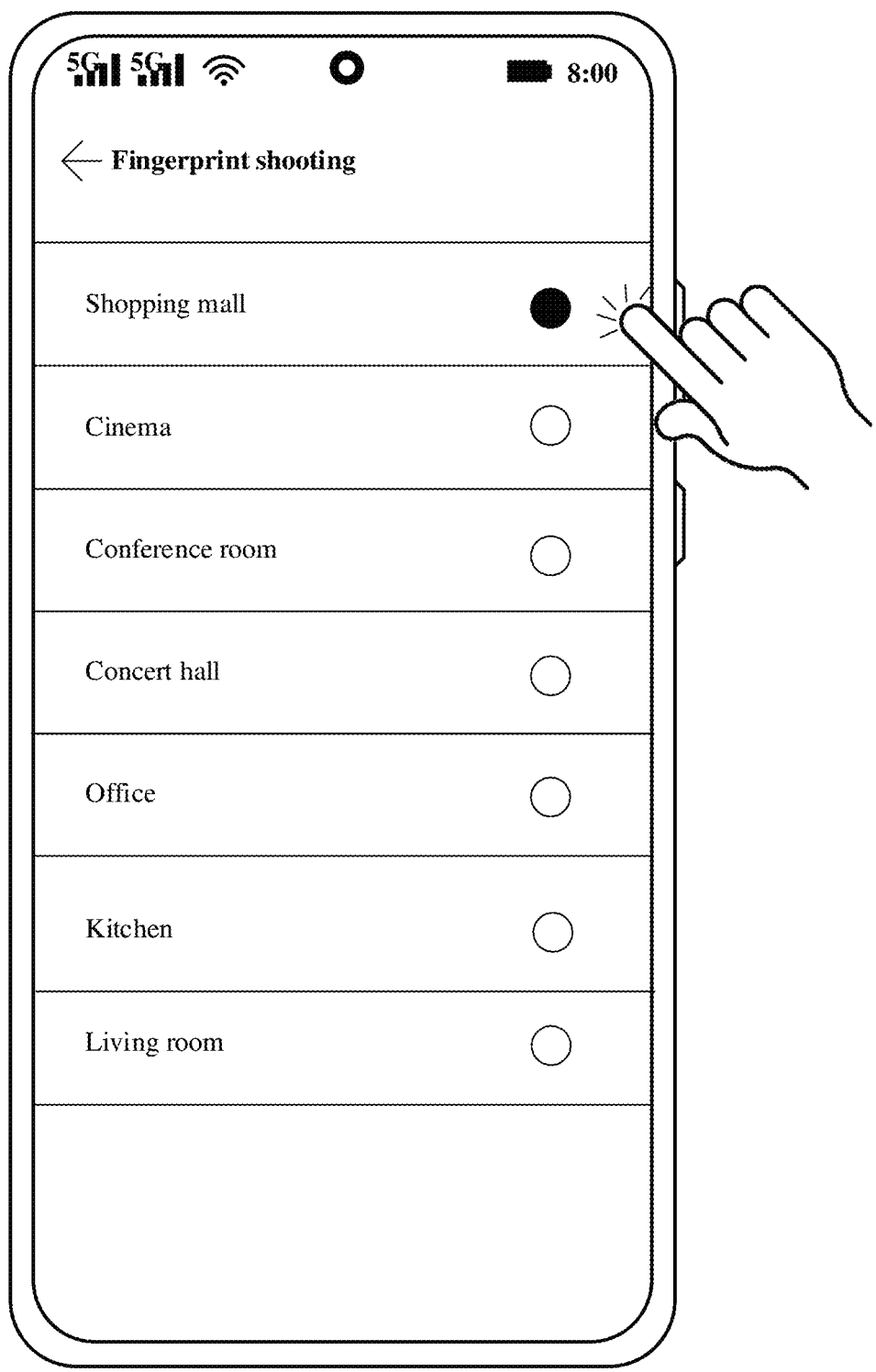

For example, as shown in FIG. 5a, a settings list of the electronic device may include a functional option "Listening scene" for setting the current scene. When the user taps on the functional option, as shown in FIG. 5b, the electronic device may display alternative room scenes in response to the tapping operation performed by the user, for example, a shopping mall, a cinema, a conference room, a concert hall, an office, a kitchen, or a living room. The user may select a corresponding room scene as the current scene through tapping.

For another example, the electronic device may intelligently recognize the current scene based on a current environment. When detecting current access to an office local area network, the electronic device determines that the current scene is an office. For another example, when detecting that a current location is a location of the user's residence, the electronic device determines that the current scene is a living room. How the electronic device intelligently recognizes the current scene is not limited in this embodiment of this application.

For example, the room impulse response database may include various room impulse responses and corresponding room scene identifiers, so that the electronic device can match a corresponding room impulse response for the current scene from the database based on a room scene identifier.

Figure 6:
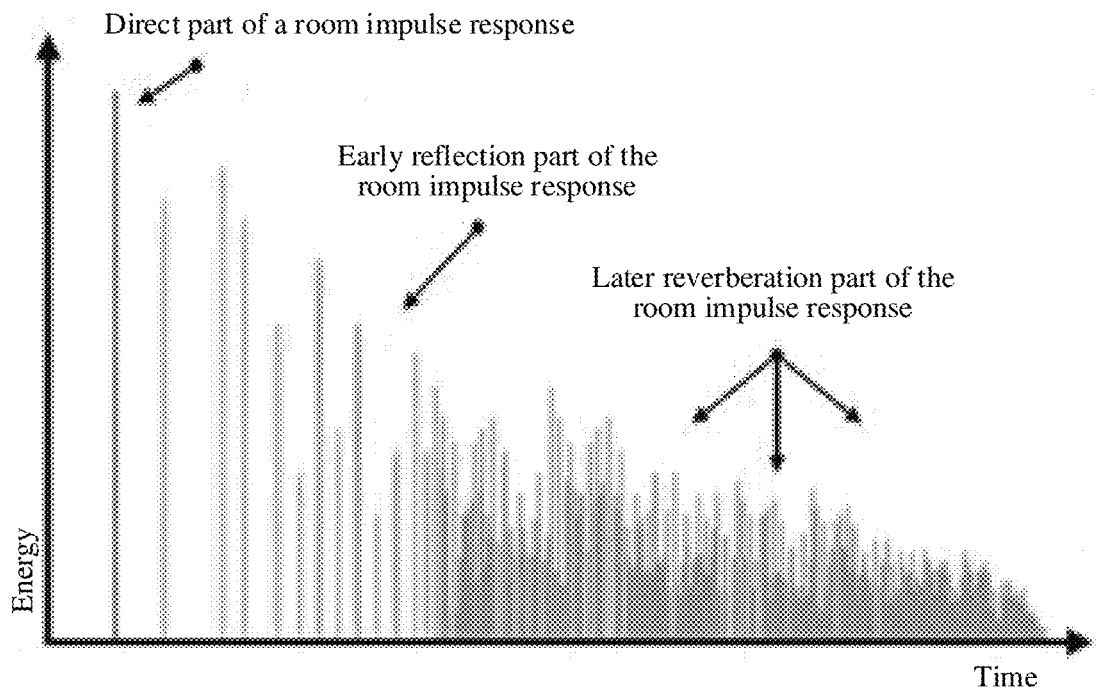
FIG. 6 is a schematic diagram of a room impulse response according to an embodiment of this application.

It should be noted that as shown in FIG. 6, when an audio signal is propagated from a sound source to a receiver in a room, a part of the signal (namely, a direct part of a room impulse response) directly reaches the receiver, another part of the signal (namely, an early reflection part of the room impulse response) is reflected by a wall of the room and then reaches the receiver, and another part of the signal (namely, a later reverberation part of the room impulse response) is reflected and diffused by the wall of the room and then reaches the receiver. The part that directly reaches the receiver has a shortest propagation path, and therefore usually arrives first and has highest energy. The part that is reflected and diffused by the wall and then reaches the receiver arrives last due to the reflection and continuous diffusion, and has lowest energy. The direct part of the room impulse response mainly affects location information of a sound source in a sound field, and the later reverberation part of the room impulse response mainly affects surround sound and a sense of space of the sound field.

Therefore, in this embodiment of this application, the room impulse response may be decomposed based on the room impulse response characteristics shown in FIG. 6, to obtain the direct part of the room impulse response, the early reflection part of the room impulse response, and the later reverberation part of the room impulse response. For example, the room impulse response may be decomposed based on time, magnitude of energy, and energy density. This is not limited herein.

S303: Perform synthesis based on the direct part of the room impulse response, the early reflection part of the room impulse response, and a head-related transfer function to obtain a first binaural room impulse response for sense-of-orientation rendering.

It should be noted that the sense-of-orientation rendering is mainly intended to accurately restore a location of a sound image in a spatial sound field. Therefore, the first binaural room impulse response including orientation information needs to be obtained through synthesis to render a corresponding sound image. In addition, a direct part of an audio signal obtained through upmixing mainly includes dialogs and human voices. Therefore, the synthesized first binaural room impulse response cannot include a reverberation component. This leads to serious coloration of human voice signals. Therefore, synthesis may be performed based on the direct part of the room impulse response, the early reflection part of the room impulse response, and the head-related transfer function to obtain the first binaural room impulse response.

The head-related transfer function may be a head-related transfer function corresponding to each orientation of the user's head in a preset head-related transfer function database.

Figure 7A:
FIG. 7*a* and FIG. 7*b* are schematic diagrams of a scenario in which a user is aware of an orientation of a sound image according to an embodiment of this application.
Figure 7A:
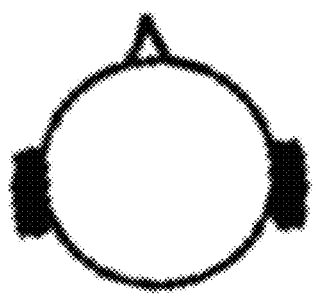
Figure 7B:
Figure 7B:
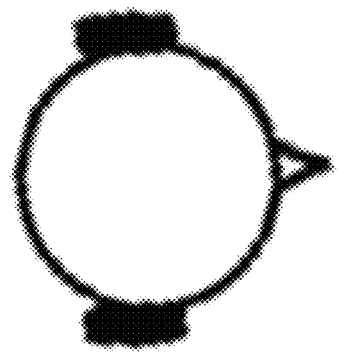

Optionally, the head-related transfer function may alternatively be a head-related transfer function obtained through adjustment and matching on a head-related transfer function in the preset head-related transfer function database based on head tracking information obtained by the headset by tracking the user's head. In this way, orientations of sound images in a finally rendered audio signal do not rotate in space along with rotation of the user's head. For example, as shown in FIG. 7a, an orientation of a sound image (for example, guitar sound) A in the audio signal is directly in front of the user's head. In this case, as shown in FIG. 7b, when the user's head rotates 90 degrees to the right, the audio signal is processed based on a head-related transfer function adjusted based on head tracking information, and an orientation of the sound image A that is perceived by the user changes to the left of the user's head. That is, the orientations of the sound images in the audio signal can remain stationary in space, so that the orientations of the sound images have a relative displacement with the user's head along with rotation of the user's head, to provide the user with speaker-like immersive experience when the user listens to sound.

For example, an inertial sensor (for example, an acceleration sensor or a gyro sensor) may be disposed in the headset to track the user's head, and detect rotation of the user's head to obtain head tracking information. In this way, when the user's head rotates, the headset sends detected head tracking information to the electronic device. The electronic device may perform matching and adjustment on a head-related transfer function in the preset head-related transfer function database based on the head tracking information.

It should be noted that the head-related transfer function corresponds to each orientation of the head, that is, each orientation of the user's head corresponds to one head-related transfer function. In this way, after an orientation of a sound image in the audio signal is processed by using a head-related transfer function in a corresponding orientation of the user's head, the user can perceive that an orientation of the sound image is a corresponding orientation. For example, a sound image is processed by using a head-related transfer function corresponding to the front of the user's head. In this case, the user can perceive that an orientation of the sound image is directly in front of the head. Therefore, to enable the user to perceive a sound image in a corresponding orientation, a head-related transfer function corresponding to each orientation of the user's head is fixed.

Usually, a corresponding orientation is marked for a head-related transfer function, and the marked orientation is consistent with a head orientation corresponding to the head-related transfer function. For example, an orientation marked for the head-related transfer function corresponding to the front of the head is the front, and an orientation marked for a head-related transfer function corresponding to the left of the head is the left. In this way, during processing of a sound image in each orientation in the audio signal, a corresponding sound image may be processed by using a head-related transfer function whose marked orientation corresponds to an orientation of the sound image. Further, when the user's head is in a default state (usually, the default state is that the user's head directly faces the electronic device), an orientation of a corresponding sound image that is perceived by the user can be consistent with an orientation of the sound image. However, when the user's head rotates, a head-related transfer function for processing each sound image remains unchanged, but an orientation perceived by the user rotates along with the rotation of the user's head. For the user, a perceived orientation of a sound image is not stationary in space.

Therefore, when the user's head rotates, an orientation marked for each head-related transfer function may be adjusted to change a head-related transfer function used for processing a sound image in a corresponding orientation. Further, the user's perception of an orientation of the sound image changes, so that when the user's head rotates, a perceived orientation of a sound image can have a relative displacement with the user's head. In this way, an orientation of the sound image that is perceived by the user can remain stationary in space when the user's head rotates.

For example, a manner of performing matching and adjustment on a head-related transfer function in the preset head-related transfer function database based on head tracking information may be as follows: After a rotational angle of the user's head is determined based on the head tracking information, an orientation marked for a head-related transfer functions in each orientation of the user's head is re-marked based on the rotational angle of the user's head. For example, based on the rotational angle of the user's head, an orientation marked for each head-related transfer function is adjusted to an orientation obtained through rotation by a corresponding angle. In this way, a sound image in the audio signal can be processed based on a head-related transfer function with a re-marked orientation, so that an orientation of the sound image has a relative displacement along with rotation of the user's head, but the orientation remains stationary in space.

Figure 8A:
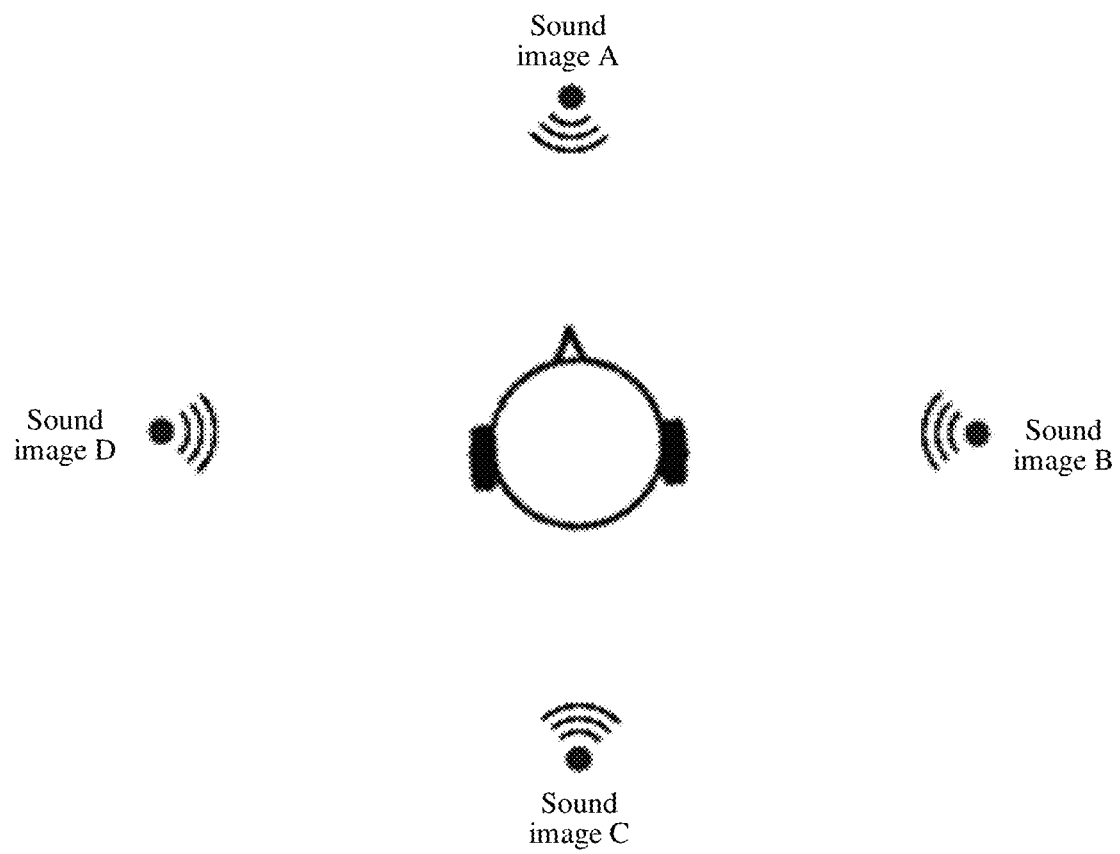
FIG. 8*a* and FIG. 8*b* are schematic diagrams of another scenario in which a user is aware of an orientation of a sound image according to an embodiment of this application.
Figure 8B:
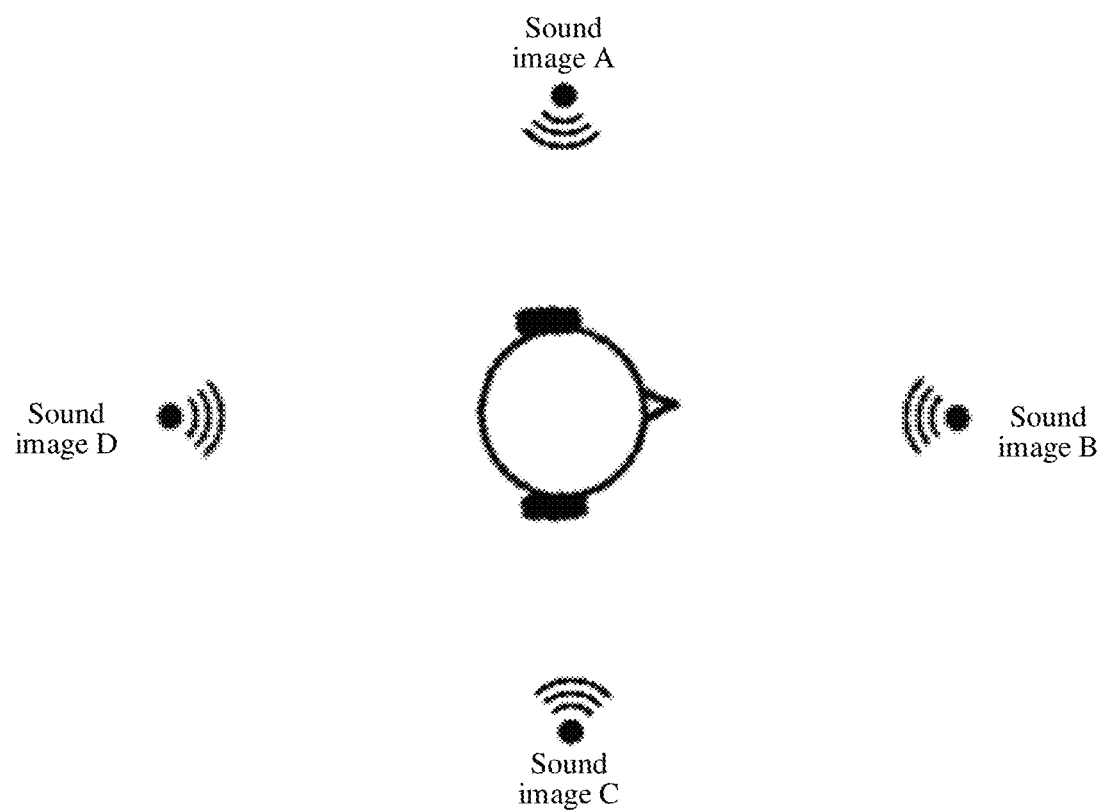

For example, as shown in FIG. 8a, when the user's head directly faces the electronic device (that is, when the user's head is in the default state), the user perceives that an orientation of a sound image A is directly in front of the user's head, the user perceives that an orientation of a sound image B is on the right of the user's head, the user perceives that an orientation of a sound image C is directly behind the user's head, and the user perceives that an orientation of a sound image D is on the left of the user's head. When the user's head rotates 90 degrees to the right, as shown in FIG. 8b, if the orientations of the sound image A, the sound image B, the sound image C, and the sound image D remains unchanged in space, an orientation of the sound image B that is perceived by the user should be directly in front of the user's head, a perceived orientation of the sound image C should be on the right of the user's head, a perceived orientation of the sound image D should be directly behind the user's head, and a perceived orientation of the sound image A should be on the left of the user's head. Therefore, in this case, the sound image B should be processed by using a head-related transfer function corresponding to the front of the user's head. Therefore, an orientation marked for the head-related transfer function corresponding to the front of the user's head should be adjusted from an orientation corresponding to the sound image A (that is, the front) to an orientation corresponding to the sound image B (that is, the right). Similarly, in this case, the sound image C should be processed by using a head-related transfer function corresponding to the right of the user's head. Therefore, an orientation marked for the head-related transfer function corresponding to the right of the user's head should be adjusted from the orientation corresponding to the sound image B (that is, the right) to an orientation corresponding to the sound image C (that is, the rear). In this case, the sound image D should be processed by using a head-related transfer function corresponding to the rear of the user's head. Therefore, an orientation marked for the head-related transfer function corresponding to the rear of the user's head should be adjusted from the orientation corresponding to the sound image C (that is, the rear) to an orientation corresponding to the sound image C (that is, the left). In this case, the sound image A should be further processed by using a head-related transfer function corresponding to the left of the user's head. Therefore, an orientation marked for the head-related transfer function corresponding to the left of the user's head should be adjusted from the orientation corresponding to the sound image D (that is, the left) to the orientation corresponding to the sound image A (that is, the front).

That is, in the examples shown in FIG. 8a and FIG. 8b, when the user's head rotates 90 degrees to the right, the orientations marked for the head-related transfer functions in the front, right, rear, and left orientations of the user's head may be respectively adjusted to orientations obtained through rotation to the right by 90 degrees. For example, the orientation marked for the head-related transfer function directly in front of the user is adjusted from the front to the right, the orientation marked for the head-related transfer function on the right of the user is adjusted from the right to the rear, the orientation marked for the head-related transfer function directly behind the user is adjusted from the rear to the left, and the orientation marked for the head-related transfer function on the left of the user is adjusted from the left to the front.

Optionally, the first binaural room impulse response may be a binaural room impulse response that is used for rendering sound images in different orientations and that is obtained by performing convolution and synthesis on a head-related transfer function in each direction with the direct part of the room impulse response and the early reflection part of the room impulse response. Therefore, a sound image in a corresponding orientation may be subsequently rendered based on the first binaural room impulse response.

S304: Render the direct part of the audio signal and the diffusion part of the audio signal based on the first binaural room impulse response to obtain a sense-of-orientation rendered audio signal.

For example, the direct part of the audio signal and the diffusion part of the audio signal each may be rendered through convolution with the first binaural room impulse response based on a preset ratio coefficient. Therefore, a sound image in each orientation in the audio signal is processed based on the direct part and the early reflection part of the room impulse response in the first binaural room impulse response and a head-related transfer function in a corresponding orientation, to render an orientation of each sound image in the audio signal.

Usually, the sense-of-orientation rendered audio signal obtained through rendering based on the first binaural room impulse response is a dual-channel audio signal (for example, including a left-channel signal and a right-channel signal of the sense-of-orientation rendered audio signal), to facilitate dual-channel input to the headset.

S305: Perform synthesis based on the early reflection part of the room impulse response, the later reverberation part of the room impulse response, and a head-related transfer function in a specified orientation to obtain a second binaural room impulse response for sense-of-space rendering.

It should be noted that the sense-of-space rendering is mainly intended to achieve a sense of space and surround sound of a replay sound field, and make audio rendering effects match an environment in which the user is currently located, to achieve immersive experience. The sense-of-space rendering is mainly performed based on the diffusion part (for example, a left-channel diffusion part and a right-channel diffusion part) of the audio signal. This part of the audio signal mainly includes ambient sound such as rain, wind, bird sound, and such signals have weak directionality. Therefore, the correspondingly generated second binaural room impulse response cannot include much orientation information (a part of the audio signal including orientation information is already included in sense-of-orientation rendering). Therefore, synthesis may be performed based on the early reflection part of the room impulse response, the later reverberation part of the room impulse response, and the head-related transfer function in the specified orientation to obtain the second binaural room impulse response.

The head-related transfer function in the specified orientation (namely, a head-related transfer function in a preset orientation) may be a preset head-related transfer function around several specific orientations of orientations corresponding to the user's head. For example, the head-related transfer function may be a head-related transfer function corresponding to the front of the user's head, a head-related transfer function corresponding to the rear of the user's head, a head-related transfer function corresponding to the left of the user's head, a head-related transfer function corresponding to the right of the user's head, a head-related transfer function corresponding to an orientation above the user's head, or a head-related transfer function corresponding to an orientation below the user's head.

Optionally, the second binaural room impulse response may be obtained by performing convolution and synthesis on the early reflection part of the room impulse response, the later reverberation part of the room impulse response, and the head-related transfer function in the specified orientation.

S306: Render the diffusion part of the audio signal based on the second binaural room impulse response to obtain a sense-of-space rendered audio signal.

For example, the diffusion part of the audio signal (for example, the left-channel diffusion part and the right-channel diffusion part) may be rendered through convolution with the second binaural room impulse response, to restore surround sound and a sense of space in a sound field of the audio signal through rendering.

Usually, the sense-of-space rendered audio signal obtained through rendering based on the second binaural room impulse response is a dual-channel audio signal (for example, including a left-channel signal and a right-channel signal of the sense-of-space rendered audio signal), to facilitate dual-channel input to the headset.

S307: Synthesize the sense-of-orientation rendered audio signal and the sense-of-space rendered audio signal, and input a synthesized signal to the headset.

For example, the left-channel signal of the sense-of-orientation rendered audio signal and the left-channel signal of the sense-of-space rendered audio signal are superposed to obtain a left-channel signal of a rendered signal, and the right-channel signal of the sense-of-orientation rendered audio signal and the right-channel signal of the sense-of-space rendered audio signal are superposed to obtain a right-channel signal of the rendered signal. Therefore, the left-channel signal of the rendered signal and the right-channel signal of the rendered signal that are finally obtained are input to the headset, to be played through the headset.

It should be noted that, in the method shown in FIG. 3, a sequence of S301 and S302 is not limited, and a sequence of S303 and S305 is not limited either, provided that S304 is performed after S304 and S306 is performed after S305. This is not limited herein.

Figure 9:
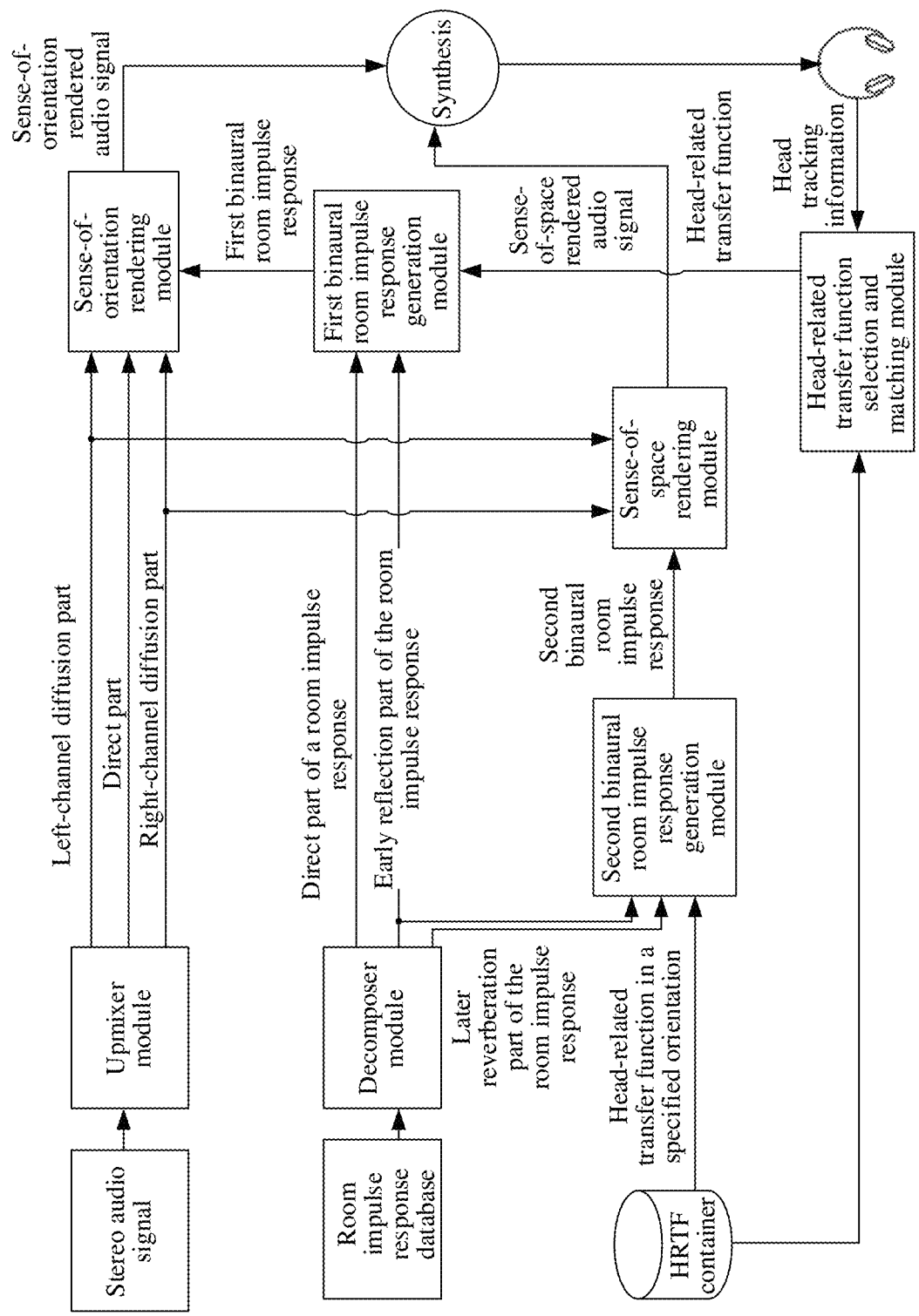
FIG. 9 is a schematic flowchart of another audio processing method according to an embodiment of this application.

In an embodiment of this application, based on the method shown in FIG. 3, as shown in FIG. 9, an electronic device may include a room impulse response database, a head-related transfer function container (HRTF container), a head-related transfer function selection and matching module, an upmixer module, a decomposer module, a first binaural room impulse response generation module, a second binaural room impulse response generation module, a sense-of-orientation rendering module, a sense-of-space rendering module, a synthesis module, and the like.

When the electronic device generates a stereo audio signal, the upmixer module may split the stereo audio signal into a direct part, a left-channel diffusion part, and a right-channel diffusion part through upmixing. The decomposer module may obtain a room impulse response corresponding to a current scene from a room impulse response database based on the current scene, and decompose the room impulse response into a direct part of the room impulse response, an early reflection part of the room impulse response, and a later reverberation part of the room impulse response. Therefore, the first binaural room impulse response generation module may perform synthesis based on the direct part of the room impulse response, the early reflection part of the room impulse response, and a head-related transfer function (the head-related transfer function may be obtained by the head-related transfer function selection and matching module from a head-related transfer function container through selection and matching based on head tracking information sent by a headset, where for details, refer to S303), to obtain a first binaural room impulse response. The sense-of-orientation rendering module may render the direct part, the left-channel diffusion part, and the right-channel diffusion part of the audio signal based on the first binaural room impulse response to obtain a sense-of-orientation rendered audio signal. The second binaural room impulse response generation module may perform synthesis based on the early reflection part of the room impulse response, the later reverberation part of the room impulse response, and a head-related transfer function in a specified direction to obtain a second binaural room impulse response. The sense-of-space rendering module may render the left-channel diffusion part and the right-channel diffusion part of the audio signal based on the second binaural room impulse response to obtain a sense-of-space rendered audio signal. Finally, the synthesis module may synthesize the sense-of-orientation rendered audio signal and the sense-of-space rendered audio signal, and input a synthesized signal to the headset.

According to the method in the foregoing embodiments, measurement of a room impulse response is simple, and one room needs to be measured only once. Therefore, a volume of data stored in a database that includes room impulse responses of different scenes is small, facilitating storage. Based on the current scene, the binaural room impulse response for sense-of-orientation rendering and the binaural room impulse response for sense-of-space rendering in the current scene can be conveniently obtained based on the corresponding room impulse response and head-related transfer function, perform sense-of-orientation rendering and sense-of-space rendering on the audio signal. In this way, the electronic device can render the audio signal based on different scenes, to more accurately restore original expressive and immersive feelings of audio content in the audio signal in the current scene for a user through the headset.

Corresponding to the method in the foregoing embodiments, an embodiment of this application further provides an audio signal processing apparatus. The apparatus may be applied to the foregoing electronic device to implement the method in the foregoing embodiments. Functions of the apparatus may be implemented by hardware or by hardware executing corresponding software. The hardware or the software includes one or more modules corresponding to the functions. For example, the apparatus includes: a room impulse response database, a head-related transfer function container (HRTF container), a head-related transfer function selection and matching module, an upmixer module, a decomposer module, a first binaural room impulse response generation module, a second binaural room impulse response generation module, a sense-of-orientation rendering module, a sense-of-space rendering module, and a synthesis module. The related method in the foregoing embodiments can be implemented through cooperation of the foregoing modules. For details, refer to FIG. 9 and related descriptions thereof. Details are not described herein again.

It should be understood that, division of units or modules (hereinafter referred to as units) in the apparatus is merely logical function division. During an actual implementation, some or all of the units or modules may be integrated into a physical entity or may be physically separated. The units in the apparatus may all be implemented in a form of software invoked by a processing element: or may all be implemented in a form of hardware: or some units are implemented in a form of software invoked by a processing element, and some units are implemented in a form of hardware.

For example, the units may be a processing element that is independently arranged, or may be integrated in a chip of the apparatus for implementation. In addition, the units may be stored in a memory in a form of program code, and are invoked by a processing element of the apparatus to perform functions of the units. In addition, all or some of the units may be integrated together, or may be implemented independently: The processing element may also be referred to as a processor and may be an integrated circuit having a signal processing capability. In an implementation process, steps in the foregoing method or the foregoing units may be implemented by using a hardware integrated logical circuit in a processor element or may be implemented in a form of software invoked by a processing element.

In an example, the units in the apparatus may be one or more integrated circuits configured to implement the foregoing method, for example, one or more ASICs, one or more DSPs, one or more FPGAs, or a combination of at least two of these integrated circuit forms.

For another example, when a unit in the apparatus is implemented in a form of a processing element scheduling a program, the processing element may be a general-purpose processor, for example, a CPU or another processor that can invoke a program. For another example, the units may be integrated together and implemented in a form of a system-on-a-chip (system-on-a-chip, SOC).

In an implementation, the units of the apparatus for implementing the corresponding steps in the method may be implemented in a form of a processing element scheduling a program. For example, the apparatus may include a processing element and a storage element, where the processing element invokes a program stored in the storage element, to perform the method described in the foregoing method embodiments. The storage element may be a storage element located on the same chip as the processing element, that is, a storage-element-on-a-chip.

In another implementation, the program used for performing the method may be stored on a storage element located on a different chip from the processing element, that is, a storage-element-out-a-chip. In this case, the processing element invokes or loads the program from the storage-element-out-a-chip onto the storage-element-on-a-chip, to invoke the program and perform the method described in the foregoing method embodiments.

For example, an embodiment of this application may further provide an apparatus, for example, an electronic device, which may include: a processor and a memory for storing instructions executable by the processor. When the processor is configured to execute the instructions, the electronic device is enabled to implement the audio signal processing method implemented by the electronic device in the foregoing embodiments. The memory may be arranged in the electronic device or may be arranged outside the electronic device. In addition, the processor includes one or more processors.

In still another implementation, the units for implementing the steps in the foregoing method in the apparatus may be configured as one or more processing elements, and these processing elements may be disposed on the corresponding electronic device described above. The processing element herein may be an integrated circuit, for example, one or more ASICs, one or more DSPs, one or more FPGAs, or a combination of these types of integrated circuits. The integrated circuits may be integrated to form a chip.

For example, an embodiment of this application further provides a chip system, and the chip system may be applied to the foregoing electronic device. The chip system includes one or more interface circuits and one or more processors. The interface circuit and the processor are interconnected through a line. The processor receives and executes computer instructions from the memory of the electronic device through the interface circuit to implement the method related to the electronic device in the foregoing method embodiments.

An embodiment of this application further provides a computer program product, including computer instructions that are run by an electronic device, for example, the foregoing electronic device.

The foregoing descriptions about implementations allow a person skilled in the art to understand that, for the purpose of convenient and brief description, division of the foregoing function modules is taken as an example for illustration. In actual application, the foregoing functions can be allocated to different modules and implemented according to a requirement, that is, an inner structure of an apparatus is divided into different function modules to implement all or part of the functions described above.

In the several embodiments provided in this application, it should be understood that the disclosed apparatus and method may be implemented in other manners. For example, the described apparatus embodiment is merely exemplary. For example, the module or unit division is merely logical function division and may be other division during actual implementation. For example, a plurality of units or components may be combined or integrated into another apparatus, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separated. A part displayed as a unit may be one physical unit or a plurality of physical units, located at the one position, or may be distributed to different positions. Some or all of the units may be selected according to actual needs to achieve the objectives of the solutions of the embodiments.

In addition, functional units in the embodiments of this application may be integrated into one processing unit, or each of the units may be physically separated, or two or more units may be integrated into one unit. The integrated unit may be implemented in the form of hardware, or may be implemented in a form of a software functional unit.

When the integrated unit is implemented in the form of a software functional unit and sold or used as an independent product, the integrated unit may be stored in a readable storage medium. Based on such an understanding, the technical solutions in the embodiments of this application essentially or the part contributing to the related art or all or some of the technical solutions may be implemented in a form of a software product such as a program. The software product is stored in a program product such as a computer-readable storage medium and includes several instructions for instructing a device (which may be a single-chip microcomputer or a chip) or a processor (processor) to perform all or some of the steps of the methods described in the embodiments of this application. The storage medium includes any medium that can store program code, such as a USB flash drive, a removable hard disk, a ROM, a RAM, a magnetic disk, or an optical disc.

For example, an embodiment of this application may further provide a computer-readable storage medium, and the computer-readable storage medium stores computer program instructions. When the computer program instructions are executed by an electronic device, the electronic device is enabled to implement the audio signal processing method described in the foregoing method embodiments.

The foregoing descriptions are merely specific embodiments of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. An audio signal processing method, applied to an electronic device in an audio system, wherein the audio system comprises an electronic device and a headset that are communicatively connected, and the method comprises:
   splitting an audio signal into a direct part and a diffusion part;
   obtaining a corresponding room impulse response from a preset room impulse response database based on a current scene, wherein the room impulse response database comprises room impulse responses corresponding to scenes, and the current scene is a scene in which the electronic device is currently located;
   performing synthesis based on the room impulse response and a head-related transfer function to obtain a first binaural room impulse response for sense-of-orientation rendering and a second binaural room impulse response for sense-of-space rendering;
   rendering the direct part of the audio signal and the diffusion part of the audio signal based on the first binaural room impulse response to obtain a sense-of-orientation rendered audio signal;
   rendering the diffusion part of the audio signal based on the second binaural room impulse response to obtain a sense-of-space rendered audio signal; and
   synthesizing the sense-of-orientation rendered audio signal and the sense-of-space rendered audio signal, and inputting a synthesized signal to the headset.

2. The method according to claim 1, wherein the performing synthesis based on the room impulse response and a head-related transfer function to obtain a first binaural room impulse response for sense-of-orientation rendering and a second binaural room impulse response for sense-of-space rendering comprises:
   decomposing the room impulse response into a direct part of the room impulse response, an early reflection part of the room impulse response, and a later reverberation part of the room impulse response;
   performing synthesis based on the direct part of the room impulse response, the early reflection part of the room impulse response, and a head-related transfer function to obtain the first binaural room impulse response for sense-of-orientation rendering; and
   performing synthesis based on the early reflection part of the room impulse response, the later reverberation part of the room impulse response, and a head-related transfer function in a preset orientation to obtain the second binaural room impulse response for sense-of-space rendering.

3. The method according to claim 2, wherein the head-related transfer function is a head-related transfer function obtained through matching and adjustment based on head tracking information sent by the headset.

4. The method according to claim 2, wherein the head-related transfer function in the preset orientation comprises: a head-related transfer function directly in front of a user's head, a head-related transfer function directly behind the user's head, a head-related transfer function on the left of the user's head, a head-related transfer function on the right of the user's head, a head-related transfer function above the user's head, and a head-related transfer function below the user's head.

5. The method according to claim 1, wherein the diffusion part of the audio signal comprises a left-channel diffusion part and a right-channel diffusion part.

6. The method according to claim 1, wherein the current scene is a scene selected by the user.

7. The method according to claim 1, wherein the current scene is a scene recognized by the electronic device.

8. The method according to claim 1, wherein the current scene comprises any one of a shopping mall, a cinema, a conference room, a concert hall, an office, a kitchen, and a living room.

9. The method according to claim 1, wherein the preset room impulse response database comprises a room impulse response autonomously measured by the user.

10. The method according to claim 1, wherein the preset room impulse response database is stored in a cloud server.

11. An electronic device, comprising:
a processor, and a memory configured to store executable instructions of the processor, wherein when the processor is configured to execute the instructions, the electronic device is enabled to perform a method in an audio system, wherein the audio system comprises the electronic device and a headset that are communicatively connected, the method comprising:
splitting an audio signal into a direct part and a diffusion part;
obtaining a corresponding room impulse response from a preset room impulse response database based on a current scene, wherein the room impulse response database comprises room impulse responses corresponding to scenes, and the current scene is a scene in which the electronic device is currently located;
performing synthesis based on the room impulse response and a head-related transfer function to obtain a first binaural room impulse response for sense-of-orientation rendering and a second binaural room impulse response for sense-of-space rendering:
rendering the direct part of the audio signal and the diffusion part of the audio signal based on the first binaural room impulse response to obtain a sense-of-orientation rendered audio signal;
rendering the diffusion part of the audio signal based on the second binaural room impulse response to obtain a sense-of-space rendered audio signal; and
synthesizing the sense-of-orientation rendered audio signal and the sense-of-space rendered audio signal, and inputting a synthesized signal to the headset.

12. A non-transitory computer-readable storage medium, storing computer program instructions, wherein when the computer program instructions are executed by an electronic device, the electronic device is enabled to perform a method applied to an electronic device in an audio system, wherein the audio system comprises the electronic device and a headset that are communicatively connected, the method comprising:
splitting an audio signal into a direct part and a diffusion part;
obtaining a corresponding room impulse response from a preset room impulse response database based on a current scene, wherein the room impulse response database comprises room impulse responses corresponding to scenes, and the current scene is a scene in which the electronic device is currently located;
performing synthesis based on the room impulse response and a head-related transfer function to obtain a first binaural room impulse response for sense-of-orientation rendering and a second binaural room impulse response for sense-of-space rendering;
rendering the direct part of the audio signal and the diffusion part of the audio signal based on the first binaural room impulse response to obtain a sense-of-orientation rendered audio signal;
rendering the diffusion part of the audio signal based on the second binaural room impulse response to obtain a sense-of-space rendered audio signal; and
synthesizing the sense-of-orientation rendered audio signal and the sense-of-space rendered audio signal, and inputting a synthesized signal to the headset.

13. The electronic device according to claim 11, wherein the performing synthesis based on the room impulse response and a head-related transfer function to obtain a first binaural room impulse response for sense-of-orientation rendering and a second binaural room impulse response for sense-of-space rendering comprises:
decomposing the room impulse response into a direct part of the room impulse response, an early reflection part of the room impulse response, and a later reverberation part of the room impulse response;
performing synthesis based on the direct part of the room impulse response, the early reflection part of the room impulse response, and a head-related transfer function to obtain the first binaural room impulse response for sense-of-orientation rendering; and
performing synthesis based on the early reflection part of the room impulse response, the later reverberation part of the room impulse response, and a head-related transfer function in a preset orientation to obtain the second binaural room impulse response for sense-of-space rendering.

14. The electronic device according to claim 13, wherein the head-related transfer function is a head-related transfer function obtained through matching and adjustment based on head tracking information sent by the headset.

15. The electronic device according to claim 13, wherein the head-related transfer function in the preset orientation comprises: a head-related transfer function directly in front of a user's head, a head-related transfer function directly behind the user's head, a head-related transfer function on the left of the user's head, a head-related transfer function on the right of the user's head, a head-related transfer function above the user's head, and a head-related transfer function below the user's head.

16. The electronic device according to claim 11, wherein the diffusion part of the audio signal comprises a left-channel diffusion part and a right-channel diffusion part.

17. The electronic device according to claim 11, wherein the current scene is a scene selected by the user.

18. The electronic device according to claim 11, wherein the current scene is a scene recognized by the electronic device.

19. The electronic device according claim 11, wherein the current scene comprises any one of a shopping mall, a cinema, a conference room, a concert hall, an office, a kitchen, and a living room.

20. The electronic device according to claim 11, wherein the preset room impulse response database comprises a room impulse response autonomously measured by the user.

* * * * *